US007065728B2

United States Patent
Bakir et al.

(10) Patent No.: US 7,065,728 B2
(45) Date of Patent: Jun. 20, 2006

(54) METHOD FOR PLACING ELECTROSTATIC DISCHARGE CLAMPS WITHIN INTEGRATED CIRCUIT DEVICES

(75) Inventors: Lu'ay Bakir, Bolton Valley, VT (US); Ciaran J. Brennan, Essex Junction, VT (US); Joseph N. Kozhaya, Essex Junction, VT (US); Robert A. Proctor, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 10/711,633

(22) Filed: Sep. 29, 2004

(65) Prior Publication Data

US 2006/0075368 A1 Apr. 6, 2006

(51) Int. Cl.
*G06F 17/50* (2006.01)

(52) U.S. Cl. .................. 716/8; 716/2; 716/9; 716/10

(58) Field of Classification Search .................. 716/8, 716/9, 10, 2
See application file for complete search history.

(56) References Cited

U.S. PATENT DOCUMENTS

| 5,362,249 | A | * | 11/1994 | Carter | 439/357 |
|---|---|---|---|---|---|
| 5,744,842 | A | | 4/1998 | Ker | 257/362 |
| 6,457,157 | B1 | * | 9/2002 | Singh et al. | 716/2 |
| 6,526,548 | B1 | | 2/2003 | Voldman | 716/5 |
| 6,560,081 | B1 | | 5/2003 | Vashchenko et al. | 361/56 |
| 6,621,680 | B1 | | 9/2003 | Segervall | 361/111 |
| 2002/0153570 | A1 | | 10/2002 | Lin et al. | 257/355 |
| 2003/0173580 | A1 | | 9/2003 | Coolbaugh et al. | 257/183 |

* cited by examiner

*Primary Examiner*—Sun James Lin
(74) *Attorney, Agent, or Firm*—Michael J. LeStrange; Dillon & Yudell LLP

(57) ABSTRACT

A method for placing electrostatic discharge clamps within integrated circuit devices is disclosed. A region is initially defined within an integrated circuit design. A list of ESD-susceptible circuits located within the defined region is then generated. The center of gravity of the ESD-susceptible circuits located within the defined region is located. Next, an ESD protection device is placed at the center of gravity of the ESD-susceptible circuits located within the defined region. A determination is made as to whether or not all ESD-susceptible circuits within the list of ESD-susceptible circuits are protected by the placement of the ESD protection device. If so, the process is repeated in other regions until the entire integrated circuit is addressed. Otherwise, the defined region is divided into at least two smaller regions and the process is repeated.

20 Claims, 4 Drawing Sheets

METHOD FOR PLACING ELECTROSTATIC DISCHARGE CLAMPS WITHIN INTEGRATED CIRCUIT DEVICES

BACKGROUND OF THE INVENTION

1. Technical Field

The present invention relates to software tools in general, and, in particular, to a method within a software tool for verifying integrated circuit designs. Still more particularly, the present invention relates to a method within a software tool for placing electrostatic discharge clamps in integrated circuit devices.

2. Description of Related Art

An electrostatic discharge (ESD) event is defined as a transfer of charges between bodies of different electrostatic potentials in proximity or via direct contact. ESD poses a reliability concern for integrated circuit devices. Different models, such as human body model (HBM), machine model (MM) and charged device model (CDM), have been used for testing integrated circuit devices to make sure the integrated circuit devices are adequately protected against an ESD event. The difference among various models mainly lies in the amount of current delivered to an integrated circuit device to emulate an ESD event encountered by the integrated circuit device.

From a circuit design standpoint, ESD clamps are typically utilized to protect an integrated circuit device against an ESD event. An ESD clamp is effectively a large switch that is normally turned off except in the presence of an ESD event. During an ESD event, the switch is turned on to produce a conductive path for charges to be drained into a grounded network within the integrated circuit device.

Generally speaking, it is imperative to minimize the number of ESD clamps placed within an integrated circuit device without compromising ESD protection because the addition of ESD clamps is expensive due to their large sizes and the blockage they cause. As such, the present disclosure targets the problem of placing ESD clamps in an integrated circuit design such that the effective resistance from every ESD-susceptible circuit to the ESD clamps meets the resistance requirements as specified by technology developers.

SUMMARY OF THE INVENTION

In accordance with a preferred embodiment of the present invention, a region is initially defined within an integrated circuit design. A list of ESD-susceptible circuits located within the defined region is then generated. The center of gravity of the ESD-susceptible circuits located within the defined region is located. Next, an ESD protection device is placed at the center of gravity of the ESD-susceptible circuits located within the defined region. A determination is made as to whether or not all ESD-susceptible circuits within the list of ESD-susceptible circuits are protected by the placement of the ESD protection device. If so, the process is repeated in other regions until the entire integrated circuit is addressed. Otherwise, the defined region is divided into at least two smaller regions and the process is repeated.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

I. Definitions

Figure 1:
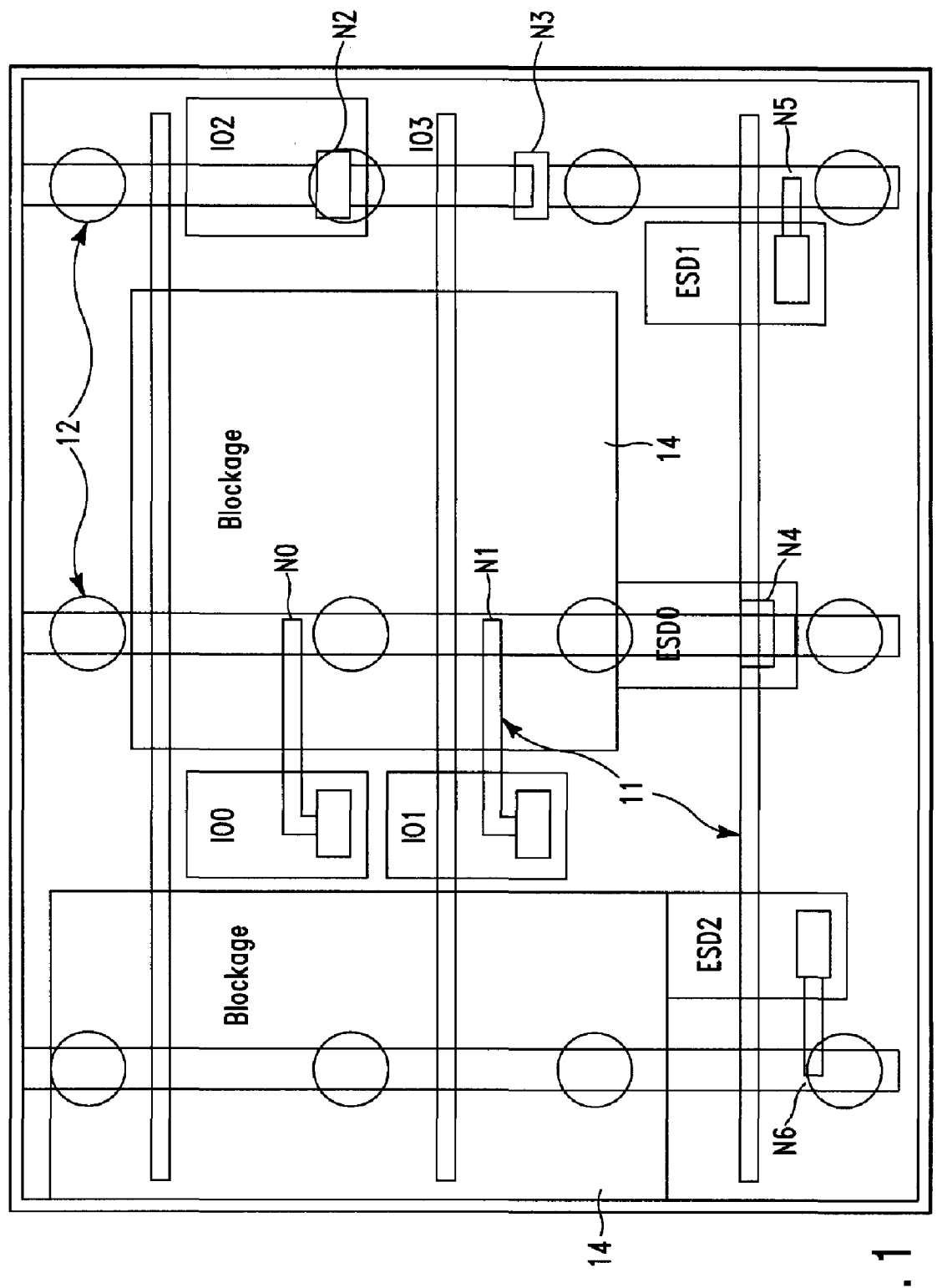
FIG. 1 illustrates a power network within an integrated circuit design, in accordance with a preferred embodiment of the present invention.

Power network: A power network is a distribution network comprising metal wires and pads that supplies power from an external power supply through the board, package and chip to individual circuits that operate at a supply voltage. In FIG. 1, a power network includes power wires 11 and power pads 12. For simplicity, the package and board portions of the power network are not shown in FIG. 1, but they are similar to the on-chip portion of the power network.

Voltage domain: A voltage domain is a geometric region on a chip that includes a power network connected to the same power supply through a package and a board. All circuits whose power supplies are connected to a power network associated with a voltage domain are assumed to belong to that voltage domain. The entire region of FIG. 1 represents one voltage domain.

Circuit: A placeable object that provides a logical or arithmetic function. A circuit may be composed of a single primitive.

Macro: A large placeable object composed of a number of circuits that provides a logical or arithmetic function.

I/O circuit: An I/O circuit acts as an interface between the logic functions on a chip and various external devices. In FIG. 1, several I/O circuits, such as IO0, IO1, IO2 and IO3, are shown. The power connections from a group of I/O circuits to the same power network imply that the group of I/O circuits belongs to the same voltage domain.

Region: A region is a geometric area on a chip where all I/O circuits in that region are handled by the algorithm independently of the I/O circuits in any other region. One voltage domain may include one or more regions.

ESD-susceptible circuit: An ESD susceptible circuit is any circuit that has a direct connection to external pads through which excess charges due to an ESD event can be imparted onto the chip.

ESD clamp: An ESD clamp is a circuit used to protect an integrated circuit device against an ESD event. An ESD clamp is essentially a large switch that turns on in the presence of excess static charges to provide an electrical path for the static charges to ground. In FIG. 1, several ESD clamps, such as ESD0, ESD1 and ESD2, are shown. Similar to the I/O circuits, the power connections from the ESD clamps are connected to a power network.

Extraction: The process of generating a power network from design data. With design data stored as GDS, the extraction process can be quite long for large designs. With design data stored as rectangles and/or centerlines with fattening, the computer run time and memory requirements are greatly reduced. A preferred approach is to use design data stored as rectangles and/or centerlines with fattening.

Power routing: Process of connecting I/O circuits, ESD clamps, and other circuits such as ESD-susceptible circuits to a power network with robust power buses.

Blockage: Blockage refers to an area on a chip where circuits cannot be placed or power routes cannot be routed, which typically occurs when there are other circuits already placed in that area. Two blockage areas 14 are shown in FIG. 1.

Power node: A power node is defined as a node generated by an intersection of the power route from an I/O circuit or ESD clamp to a power network. In FIG. 1, power nodes corresponding to all the I/O circuits and ESD clamps are shown as N0, N1, . . . N6.

Power resistance: A power resistance at an I/O circuit is the resistance of the power wires from that I/O circuit to ESD clamps. This is computed by placing an ESD clamp at every I/O power node, extracting the power network, assigning a current source at the location of the I/O circuit, assigning a voltage source at each ESD clamp, and simulating the network to compute the voltage drop at the I/O circuit. The ratio of the voltage drop to the current source is defined as the power resistance of that I/O circuit.

II. Assumptions

The methods of the present invention are preferably applicable to area-array (also known as flip-chip) integrated circuit designs. The starting point for the methods of the present invention is a chip having a floor-planned design in which large macros have been placed. The floor-planned design also includes a list of assigned and placed I/O circuits as well as a list of ESD-susceptible circuits.

For each voltage domain on a chip, both I/O circuits and ESD clamps are power-routed to the same power network. Such assumption follows from the fact that power gets supplied to the I/O circuits in the region of interest using the same power network. So in order to avoid any area and wiring impacts, the ESD clamps are power-routed to the same power network.

Since both I/O circuits and ESD clamps are power routed to the same power network, placing an ESD clamp close to an I/O circuit implies placing the ESD clamp close to the power node corresponding to the I/O circuit.

Vias, which are used to connect overlapping metal wires of same polarity on adjacent layers, are included in the analysis because their resistance may be significant. This is particularly important for achieving accurate results with the analysis tool that is based on the extraction and simulation of the entire power network.

III. ESD Clamp Placing Algorithm

Figure 2:
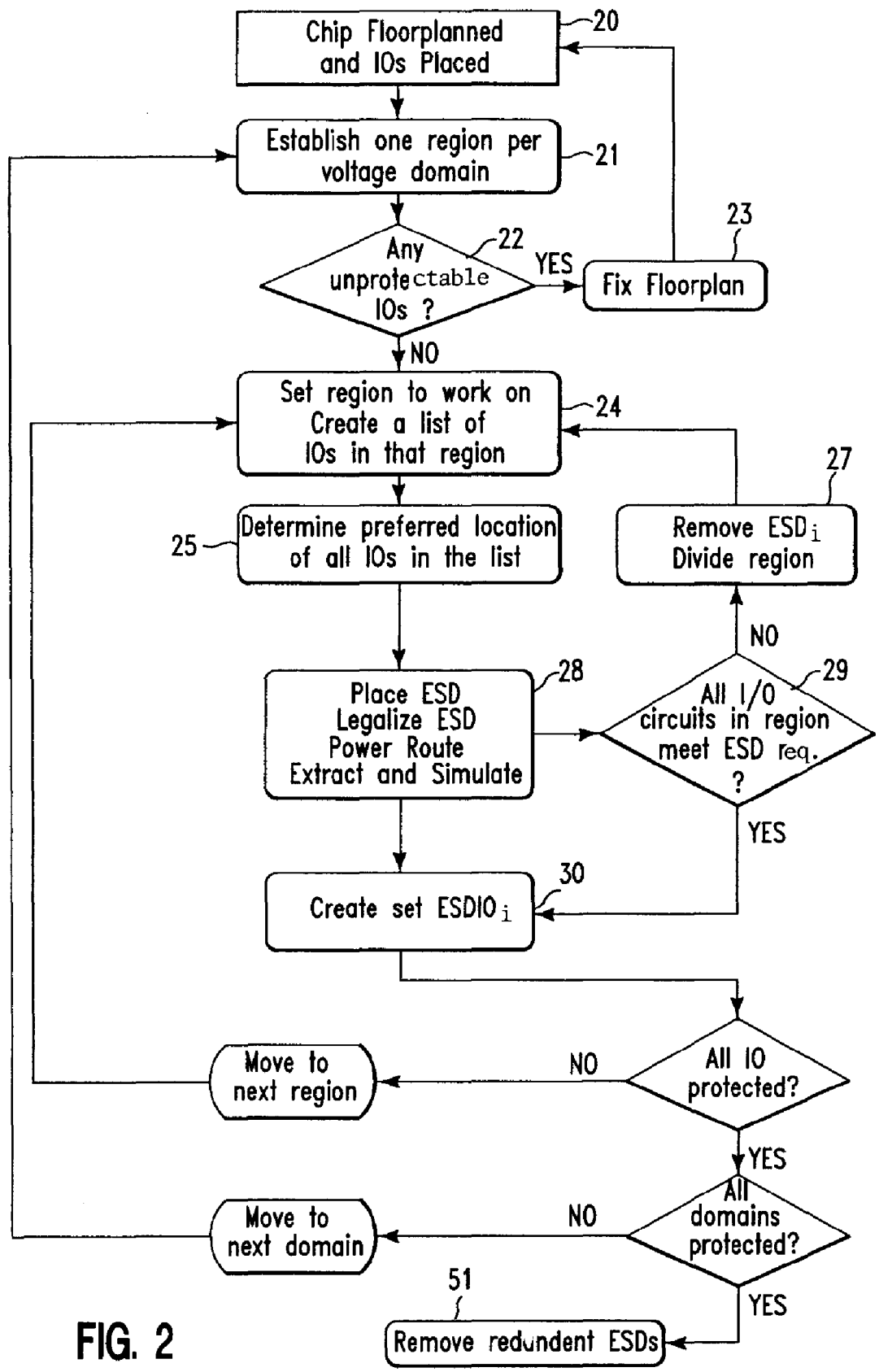
FIG. 2 is a high-level logic flow diagram of a method for placing electrostatic discharge clamps within an integrated circuit design, in accordance with a preferred embodiment of the present invention.

With reference now to FIG. 2, there is depicted a high-level logic flow diagram of a method for placing ESD clamps, in accordance with a preferred embodiment of the present invention. The starting point for the method is a floor-planned chip having I/O circuits and large macros (including ESD-susceptible circuits) placed and fixed, as shown in block 20. Then, a region is established for each voltage domain, as depicted in block 21. Next, for every region, a determination is made as to whether or not any I/O circuit in that region is unprotectable, as shown in block 22. An unprotectable I/O circuit is an I/O circuit that cannot satisfy ESD requirements under any legal placement of ESD clamps. By computing the power resistance of every I/O circuit and checking if it is larger than a predetermined DC resistance limit, it is determined whether that I/O circuit is unprotectable or not. This means that there is no legal placement of ESD clamps that can satisfy the ESD protection requirements at that I/O circuit. The step in block 22 screens out problems early on before attempting any ESD clamp placement.

If an unprotectable I/O circuit is detected, the unprotectable I/O circuit is reported to a designer so that the designer can fix the floorplan by modifying the placement of the I/O circuit, as shown in block 23. Otherwise, if no unprotectable I/O circuit is detected, a list of I/O circuits is generated in that region, as depicted in block 24.

For each region, $R_a$, a preferred location to add an ESD clamp is determined, as shown in block 25. The preferred location can be, for example, the center of gravity, $G_a$, of all the I/O circuits in the region. The coordinates for the center of gravity, $G_a$, of the region can be computed as follows:

$$x_{G_a} = \frac{\sum\limits_{j \in IOList_a} R_j x_j}{\sum\limits_{j \in IOList_a} R_j}$$

$$y_{G_a} = \frac{\sum\limits_{j \in IOList_a} R_j y_j}{\sum\limits_{j \in IOList_a} R_j}$$

where $R_j$ is the power resistance of the $j^{th}$ I/O circuit. Coordinates $(x_j, y_j)$ are the coordinates of the $j^{th}$ I/O circuit, or equivalently, the coordinates of the power node $N_j$ associated with the $j^{th}$ I/O circuit. The above-mentioned formulae attempt to find the location closest to all the I/O circuits while considering their resistance values. Thus, the location of the center of gravity will be closer to the high resistance I/O circuits and farther from the low resistance I/O circuits.

Next, an ESD clamp, $ESD_i$, is placed at the preferred location determined in block 25, as shown in block 28. In addition, the placement of the clamp, $ESD_i$, is legalized; that is, the physical requirements for placing the ESD clamp such as snapping to a grid and avoiding blockage are satisfied. Furthermore, the newly placed ESD clamp is power routed, which essentially provides power wires to connect the ESD clamp to the power network, as shown in block 28.

A determination is made as to whether or not all I/O circuits within the region, after the placement of the ESD clamp, meet the ESD requirements, as depicted in block 29. The detail of such determination is further described in FIG. 3. If any of the I/O circuits, after the placement of the ESD clamp, does not meet the ESD requirement, then the ESD clamp is removed from the region and the region is subdivided into two regions (first horizontally and then vertically or vice versa), as depicted in block 27. The I/O circuits within each of the two new regions are further considered by returning to block 24. If, on the other hand, all of the I/O circuits meet the ESD requirements after the placement of the ESD clamp, then a set, $ESDIO_i$, is generated consisting of all the I/O circuits within the region, as shown in block 30. The process returns to block 24 for a new region until all I/O circuits in all regions meet the ESD requirements.

After all the ESD clamps have been placed, the redundant ESD clamps are removed, as depicted in block 51. The purpose of this step is to minimize the number of ESD clamps by removing any ESD clamps that are not really needed. To do so, the ESD clamps are ranked in reverse order in terms of the I/O circuits they satisfy. Such information is available via the $ESDIO_i$ lists that are generated throughout the method. Then, each ESD clamp is removed from the list one at a time, and a simulation is performed. If any I/O circuit fails the ESD robustness check, as outlined in FIG. 3, after the removal of an ESD clamp; that means the removed ESD clamp is required. If not, then that ESD clamp can be safely removed.

IV. ESD Clamp Checking Algorithm

Figure 3:
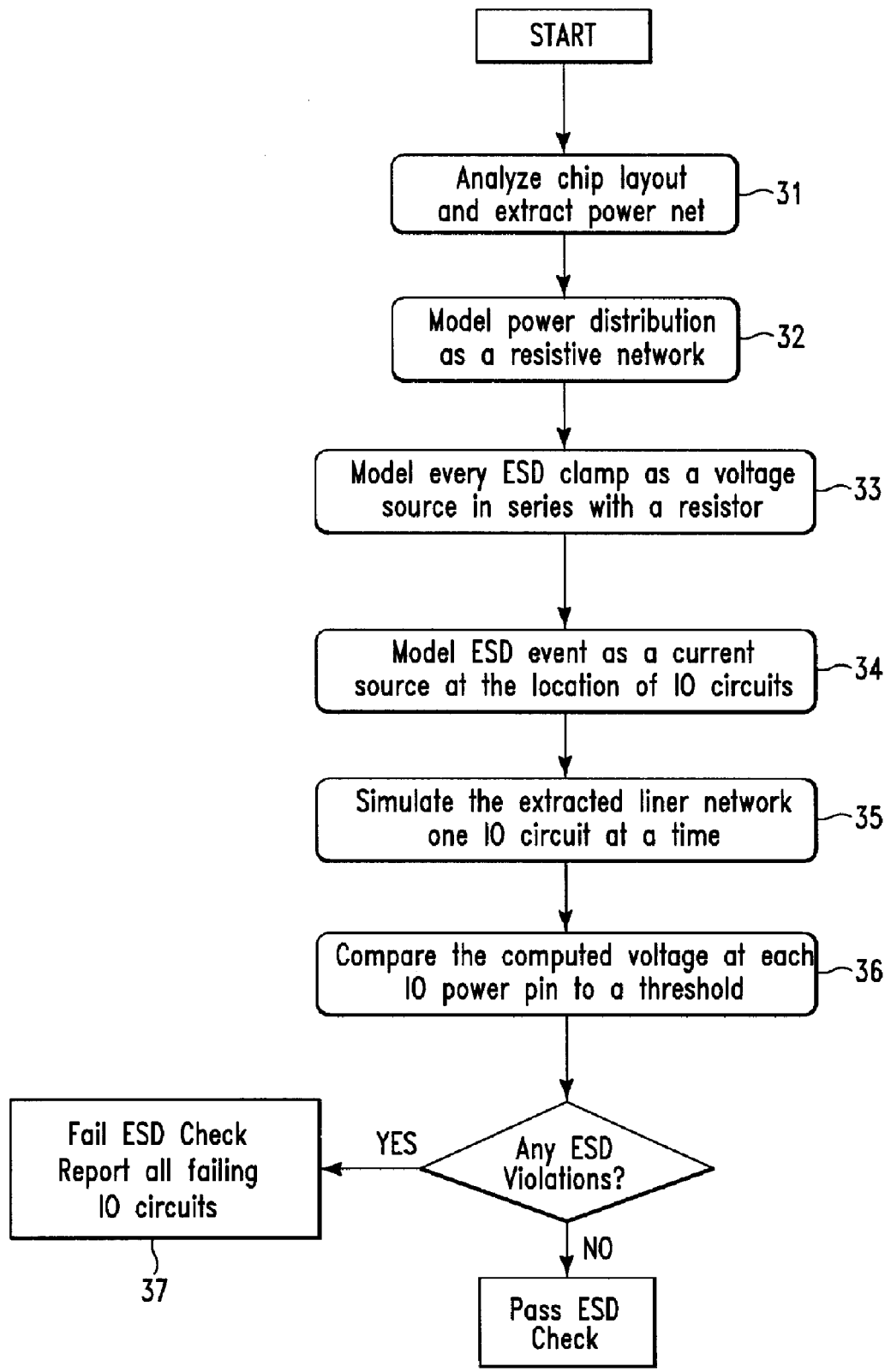
FIG. 3 is a high-level logic flow diagram of a method for checking electrostatic discharge reliability of an integrated circuit design, in accordance with a preferred embodiment of the present invention.

Referring now to FIG. 3, there is depicted a high-level logic flow diagram of a method for checking whether or not an I/O circuit meets a predetermined ESD requirement, in accordance with a preferred embodiment of the present invention. The layout of a chip is analyzed and the power network is extracted, as shown in block 31. The power distribution network of the chip is modelled as a resistive network, as depicted in block 32. For example, the resistances of all the wire segments are calculated and a resistive network model of the power distribution network is then generated. The ESD clamps for the power network are identified, and each of the identified ESD clamps is modeled as a voltage source connected in series with a resistor, as shown in block 33. For example, the associated voltage and resistance values for each ESD clamp are extracted from simulated or measured I-V curves for that ESD clamp. Then, a linearized current-voltage model having a voltage source connected in series with a resistor is inserted into the resistive network at each point where an ESD clamp is placed.

Next, the I/O circuits (and other ESD-susceptible circuits) are identified. An ESD event is modeled as a current source at the locations of the I/O circuits, as depicted in block 34. For example, a current corresponding to the peak current for the CDM design target (e.g., 10 A) is applied to the I/O circuit power pin (i.e., the connection of the I/O circuit to the I/O power route).

The ESD calculations are performed by simulating the extracted linear network for each I/O circuit, one at a time, as shown in block 35. For example, the IR drop through the power network, including the resistance and voltage drop of all the ESD clamps on the power network, is calculated. Note that the parallel paths of current through the power planes are also included in the ESD calculations.

The computed voltage at each I/O circuit power pin is compared to a predetermined voltage threshold, as depicted in block 36. The predetermined voltage threshold is preferably defined by technology developers. If the computed voltage at an I/O circuit power pin exceeds the predetermined voltage threshold, then that I/O circuit is considered as failing the ESD robustness check and will be reported, as shown in block 37. If the computed voltage at an I/O circuit power pin does not exceed the predetermined voltage threshold, then that I/O circuit is considered as passing the ESD robustness check, as depicted in block 38.

As has been described, the present invention provides a method within a software tool for placing ESD clamps in integrated circuit devices. The placement algorithm of the present invention is driven by the analysis results obtained from the extraction and simulation of the power distribution networks. The method of the present invention guarantees an ESD clamp placement that satisfies ESD robustness requirements.

Although I/O circuits are used to illustrate the present invention, it is understood by those skilled in the art that the method of the present invention is applicable to all ESD susceptible circuits.

Figure 4:
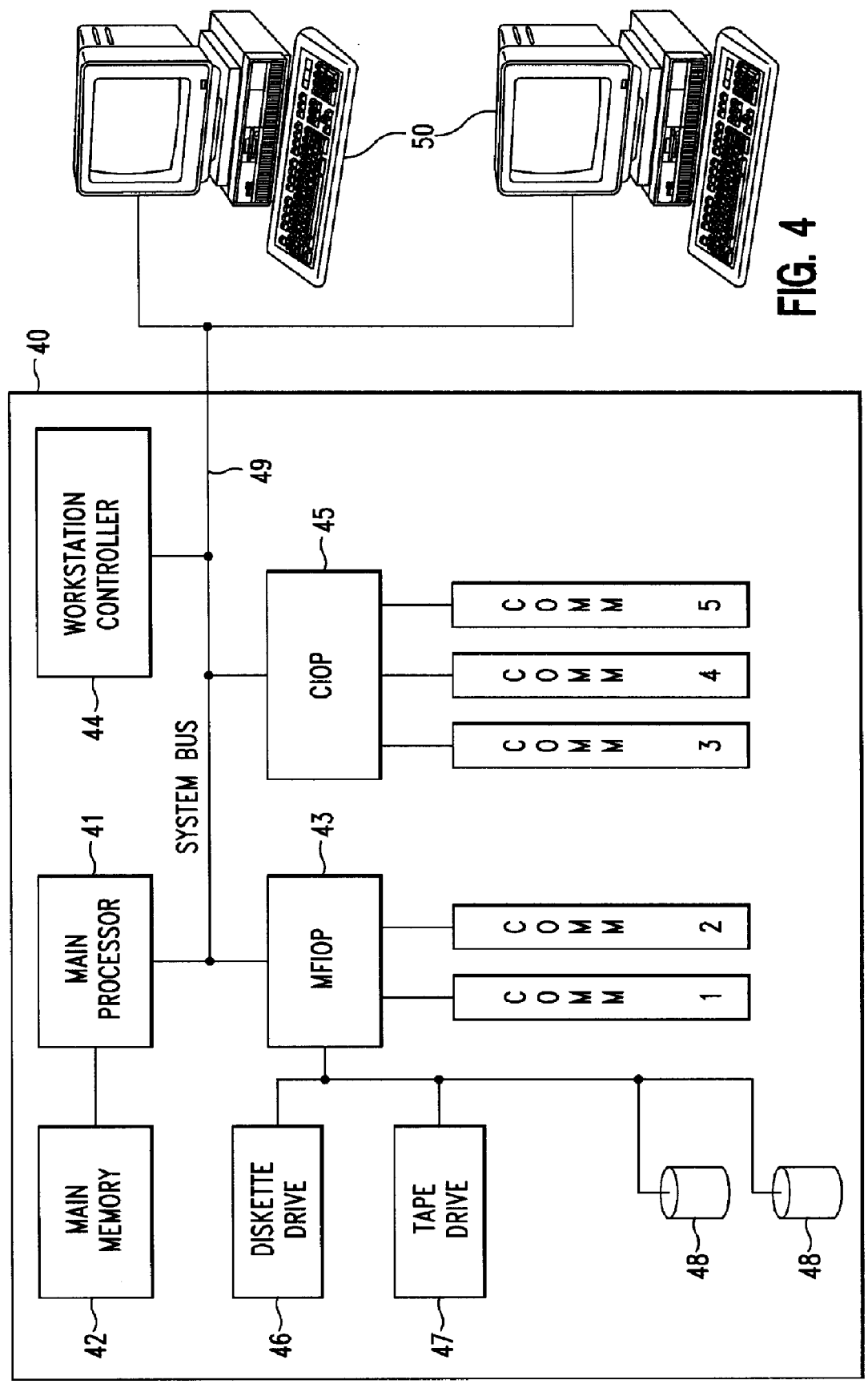
FIG. 4 is a block diagram of a computer system in which a preferred embodiment of the present invention can be implemented.

With reference now to FIG. 4, there is depicted a block diagram of a computer system in which a preferred embodiment of the present invention can be implemented. As shown, a computer system 40 includes a main processor 41 coupled to a main memory 42 and a multiple-function I/O processor (MFIOP) 43. Main processor 41 may include a single processor or multiple processors. Several peripheral storage devices, such as a diskette drive 46, a tape drive 47, and a direct access storage devices (DASDs) 48, are controlled by MFIOP 43. In addition, MFIOP 43 provides communications to other devices via communication ports such as COMM 1 and COMM 2.

A workstation controller 44 is coupled to a communications I/O processor (CIOP) 45 via a system bus 49. Workstation controller 44 provides communications between main processor 41 and workstations 50 that may be connected to computer system 40. CIOP 45 provides communications to other devices via communication ports such as COMM3, COMM4, and COMM5.

Although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for placing a plurality of electrostatic discharge (ESD) protection devices within an integrated circuit design, said method comprising:

defining a region within said integrated circuit design;

generating a list of ESD-susceptible circuits located within said defined region;

determining a preferred location for placing an ESD protection device within said region;

placing said ESD protection device at said determined preferred location;

determining whether or not any ESD-susceptible circuit within said list of ESD-susceptible circuits is protected by the placement of said ESD protection device; and generating a set of all ESD-susceptible circuits with said integrated circuit design and associating said set of all ESD-susceptible circuits with said ESD protection device if all ESD-susceptible circuits within said list of ESD-susceptible circuits are protected by the placement of said ESD protection device.

2. The method of claim 1, wherein said method further includes dividing said region if not all ESD-susceptible circuits with said list of ESD-susceptible circuits are protected by the placement of said ESD protection device.

3. The method of claim 1, wherein said method further includes reducing the number of ESD protection devices by removing redundant ESD protection devices.

4. The method of claim 1, wherein said preferred location is the center of gravity of said ESD-susceptible circuits within said defined region.

5. The method of claim 1, wherein said method further includes legalizing said placing ESD protection device at said determined location by satisfying physical requirements such as snapping to a grid and avoiding blockages.

6. The method of claim 1, wherein said method further includes identifying all ESD-susceptible circuits within said integrated circuit design that cannot satisfy ESD requirements regardless of the number of ESD protection devices placed.

7. A computer program product residing on a computer usable medium for placing a plurality of electrostatic discharge (ESD) protection devices within an integrated circuit design, said computer program product comprising:
   program code means for defining a region within said integrated circuit design;
   program code means for generating a list of ESD-susceptible circuits located within said defined region;
   program code means for determining a preferred location for placing an ESD protection device within said region;
   program code means for placing said ESD protection device at said determined preferred location;
   program code means for determining whether or not any ESD-susceptible circuit within said list of ESD-susceptible circuits is protected by the placement of said ESD protection device; and
   program code means for generating a set of all ESD-susceptible circuits within said integrated circuit design and associating said set of all ESD-susceptible circuits with said ESD protection device if all ESD-susceptible circuits within said list of ESD-susceptible circuits are protected by the placement of said ESD protection device.

8. The computer program product of claim 7, wherein said computer program product further includes program code means for dividing said region if not all ESD-susceptible circuits within said list of ESD-susceptible circuits are protected by the placement of said ESD protection device.

9. The computer program product of claim 7, wherein said computer program product further includes program code means for reducing the number of ESD protection devices by removing redundant ESD protection devices.

10. The computer program product of claim 7, wherein said preferred location is the center of gravity of said ESD-susceptible circuits within said defined region.

11. The computer program product of claim 7, wherein said computer program product further includes program code means for legalizing said placing ESD protection device at said determined location by satisfying physical requirements such as snapping to a grid and avoiding blockages.

12. The computer program product of claim 7, wherein said computer program product further includes program code means for identifying all ESD-susceptible circuits within said integrated circuit design that cannot satisfy ESD requirements regardless of the number of ESD protection devices placed.

13. A method for checking effectiveness of a plurality of electrostatic discharge (ESD) protection devices placed within an integrated circuit design, said method comprising:
   identifying all ESD-susceptible circuits within said integrated circuit design;
   modeling each of said plurality of ESD protection devices associated with said ESD-susceptible circuits as a voltage source connected in series with a resistor;
   modeling an ESD event striking on one of said ESD-susceptible circuits as a current source at said one of said ESD-susceptible circuits;
   comparing a voltage on said one of said ESD-susceptible circuits during said ESD event to a predetermined voltage threshold; and
   in a determination that said voltage on said one of said ESD-susceptible circuits during said ESD event exceeds said predetermined voltage threshold, designating said one of said ESD-susceptible circuits as failing an ESD check.

14. The method of claim 13, wherein said method further includes modeling a power distribution network of said integrated circuit design as a resistive network.

15. The method of claim 13, wherein said method further includes using a linear circuit simulator to compute the voltage at said one of said ESD-susceptible circuits during said ESD event.

16. The method of claim 13, wherein said method further includes providing a quantitative measure of failure for all of said ESD-susceptible circuits to enable efficient fix-up techniques.

17. A computer program product residing on a computer usable medium for checking effectiveness of a plurality of electrostatic discharge (ESD) protection devices placed within an integrated circuit design, said computer program product comprising:
   program code means for identifying all ESD-susceptible circuits within said integrated circuit design;
   program code means for modeling each of said plurality of ESD protection devices associated with said ESD-susceptible circuits as a voltage source connected in series with a resistor;
   program code means for modeling an ESD event striking on one of said ESD-susceptible circuits as a current source at said one of said ESD-susceptible circuits;
   program code means for comparing a voltage on said one of said ESD-susceptible circuits during said ESD event to a predetermined voltage threshold; and
   in a determination that said voltage on said one of said ESD-susceptible circuits during said ESD event exceeds said predetermined voltage threshold, program code means for designating said one of said ESD-susceptible circuits as failing an ESD check.

18. The computer program product of claim 17, wherein said computer program product further includes modeling a power distribution network of said integrated circuit design as a resistive network.

19. The computer program product of claim 17, wherein said computer program product further includes program code means for using a linear circuit simulator to compute the voltage at said one of said ESD-susceptible circuits during said ESD event.

20. The computer program product of claim 17, wherein said computer program product further includes program code means for providing a quantitative measure of failure for all of said ESD-susceptible circuits to enable efficient fix-up techniques.

* * * * *

UNITED STATES PATENT AND TRADEMARK OFFICE
CERTIFICATE OF CORRECTION

| | | |
|---|---|---|
| PATENT NO. | : 7,065,728 B2 | Page 1 of 1 |
| APPLICATION NO. | : 10/711633 | |
| DATED | : June 20, 2006 | |
| INVENTOR(S) | : Lu'ay Bakir et al. | |

It is certified that error appears in the above-identified patent and that said Letters Patent is hereby corrected as shown below:

In Claim 2, at column 6, line 62, delete "with" and insert --within--.

Signed and Sealed this

Fifth Day of December, 2006

JON W. DUDAS
*Director of the United States Patent and Trademark Office*